United States Patent [19]
Davis et al.

[11] Patent Number: 5,397,717
[45] Date of Patent: Mar. 14, 1995

[54] METHOD OF FABRICATING A SILICON CARBIDE VERTICAL MOSFET

[75] Inventors: Kenneth L. Davis, Tempe; Charles E. Weitzel, Mesa; Neal J. Mellen, Tempe, all of Ariz.

[73] Assignee: Motorola, Inc., Schaumburg, Ill.

[21] Appl. No.: 90,858

[22] Filed: Jul. 12, 1993

[51] Int. Cl.[6] .................. H01L 21/20; H01L 21/335
[52] U.S. Cl. .......................................... 437/40; 437/38; 437/90; 437/100; 437/203; 148/DIG. 148
[58] Field of Search ............... 437/40, 203, 90, 91, 437/100, 38; 148/DIG. 126, DIG. 148; 257/77

[56] References Cited
U.S. PATENT DOCUMENTS 4,859,621  8/1989  Einthoven ..................... 437/45
5,264,713  11/1993  Palmour ......................... 257/77

*Primary Examiner*—T. N. Quach
*Attorney, Agent, or Firm*—Eugene A. Parsons

[57] ABSTRACT

A silicon carbide vertical MOSFET formed on a silicon carbide substrate with portions of epitaxial layers defining the various transistor electrodes, rather than defining the electrodes with implants and diffusion. An opening is formed in some of the epitaxial layers and a conductive layer is formed therein to electrically connect a drain contact on the rear of the substrate to the components on the front of the substrate.

21 Claims, 2 Drawing Sheets

5,397,717

METHOD OF FABRICATING A SILICON CARBIDE VERTICAL MOSFET

FIELD OF THE INVENTION

The present invention pertains to methods of fabricating MOSFETs and to the devices and more particularly to methods of fabricating silicon carbide vertical MOSFETs and to the devices.

BACKGROUND OF THE INVENTION

There is currently a growing demand for power devices which offer improved operating efficiency and higher speed. Power MOSFETs have inherently higher switching speeds than bipolar transistors and thus are strong candidates for use in high frequency switch mode power supplies and inverters. The fabrication of MOSFETs include many diffusion and wet etch steps to form the various electrodes of the device in a substrate of silicon or the like, which materials are readily susceptible to such process steps.

However, silicon and the like have a relatively low breakdown voltage and poor thermal conductivity, resulting in devices which are rather severely limited in voltage, power, and operating temperature characteristics.

Some attempts have been made to rectify these shortcomings by fabricating lateral MOSFETs from silicon carbide, which is capable of withstanding a much larger breakdown voltage has a better thermal conductivity and a larger bandgap which permits operation at higher temperatures. However, lateral MOSFETs have the disadvantage of requiring much larger die area for devices capable of performing at an equivalent level with vertical structures.

It is a purpose of the present invention to provide a relatively easy method of fabricating vertical MOSFETs from silicon carbide.

It is a further purpose of the present invention to provide a method of fabricating vertical MOSFETs from silicon carbide without requiring difficult diffusion and/or implant steps.

It is a further purpose of the present invention to provide a method of fabricating vertical MOSFETs from silicon carbide without requiring difficult wet etch steps.

SUMMARY OF THE INVENTION

The above described problems are substantially solved and the above described purposes are realized in a method of fabricating a silicon carbide vertical MOSFET including the steps of providing a silicon carbide substrate of a first conductivity type and forming a first epitaxial layer of the first conductivity type on the surface of the substrate. The epitaxial layer is relatively lightly doped compared to the substrate. Forming a second epitaxial layer of a second conductivity type on the surface of the first epitaxial layer. Forming an opening through the second epitaxial layer from the surface of the second epitaxial layer so as to at least communicate with the first epitaxial layer and providing a mask on the surface of the second epitaxial layer defining and protecting a gate region. Forming a relatively thin layer of the first conductivity type adjacent the surface of the second epitaxial layer. In one embodiment the relatively thin layer is also positioned adjacent surfaces of the opening through the second epitaxial layer and in a different embodiment a conductive layer is formed in the opening, instead of using the relatively thin layer to form a substantially short circuit between the relatively thin layer and the first epitaxial layer. The mask is removed at some convenient stage of this process. It should be understood that in different embodiments the steps of defining an opening and forming a third layer may be interchanged. Forming a gate contact in overlying relationship to the gate region. Defining a source region and forming a source contact on the defined source region.

The above described problems are substantially solved and the above described purposes are further realized in a vertical FET including a semiconductor substrate of a first conductivity type with a first relatively lightly doped epitaxial layer of the first conductivity type positioned on the surface of the substrate and a second epitaxial layer of a second conductivity type positioned on the surface of the first epitaxial layer. An opening is defined by the second epitaxial layer, extending from the surface of the second epitaxial layer at least into communication with the first epitaxial layer and a relatively thin, third layer of the first conductivity type is formed in overlying relationship on the second epitaxial layer. A gate region is defined by the relatively thin layer and a gate contact is positioned in overlying relationship to the gate region. A source region is defined with a source contact positioned on the defined source region.

BRIEF DESCRIPTION OF THE DRAWINGS

Referring to the drawings.

DESCRIPTION OF THE PREFERRED EMBODIMENT

Figure 1:
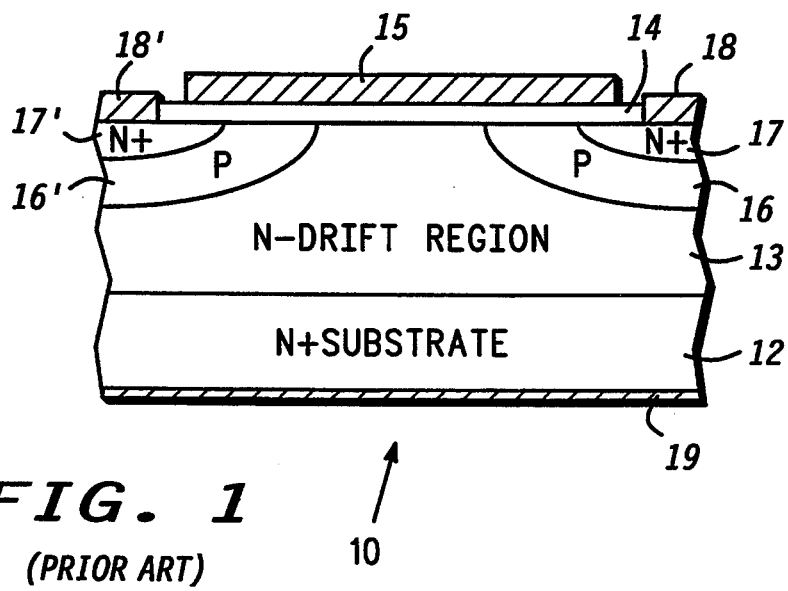
FIGS. 1 and 2 are partial sectional views of prior art DMOSFET and UMOS structures.

Referring specifically to FIG. 1, a partial sectional view of a prior art silicon, power, double diffused metal oxide semiconductor field effect transistor (DMOSFET) 10 is illustrated. Transistor 10 includes an n-type silicon substrate 12 with a lightly doped epitaxial layer 13 grown on the upper surface thereof. A layer 14 of gate oxide is deposited on the surface of epitaxial layer 13 and a refractory gate contact 15 is patterned or selectively deposited on the surface of gate oxide 14. Gate contact 15 serves as an implant or diffusion mask for subsequent steps in the manufacturing process. With gate contact 15 defining the gate and/or channel regions, a first impurity diffusion is performed to form p-type regions 16 and 16'. It will of course be understood by those skilled in the art, that p-type regions 16 and 16' form semi-elliptical tubs and only one half of each tub is illustrated for convenience.

A second impurity diffusion is performed to form n+-regions 17 and 17' within p-type regions 16 and 16'. As is understood in the art, region 17 forms a transistor source, the portion of region 16 adjacent gate 15 forms a channel for the passage of current when proper voltages are applied to transistor 10, and substrate 12 forms the transistor drain. Similarly, region 17' forms a transistor source, the portion of region 16' adjacent gate 15 forms a channel for the passage of current when proper voltages are applied to transistor 10, and substrate 12 forms the transistor drain. Thus, transistor 10, as illustrated in FIG. 1, is really a pair of transistors operating in parallel. Portions of gate oxide layer 14 are removed and refractory source contacts 18 and 18' are deposited in electrical contact with n+-regions 17 and 17', respectively. Also, a metal or refractory drain contact 19 is deposited on the reverse side of substrate 12 to complete transistor 10.

Figure 2:
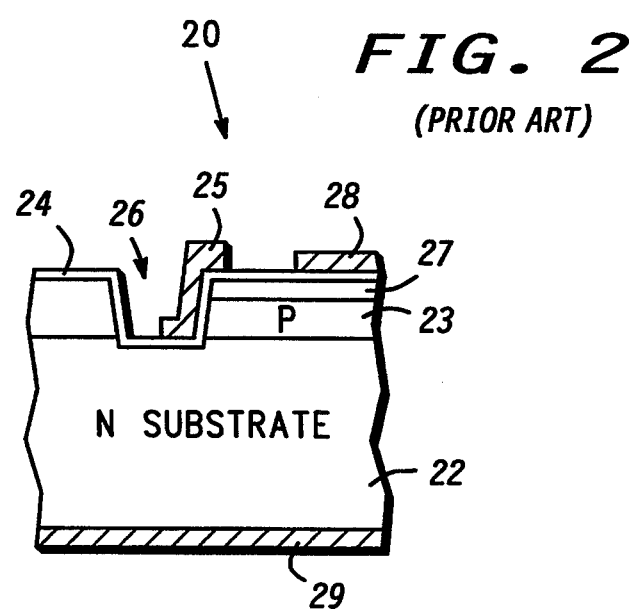

Referring specifically to FIG. 2, a partial sectional view of a prior art UMOS transistor 20 is illustrated. Transistor 20 includes an n-type silicon substrate 22 with a p-type epitaxial layer 23 grown on the surface thereof. Substrate 22 is etched by an anisotropic wet chemical etch to provide an opening 26 with sloped sides. A layer 24 of gate oxide is formed over the surface of the structure, including the bottom and sides of opening 26 and a gate contact 25 is deposited on gate oxide layer 24 along the bottom and sides of opening 26 as well as along a portion of the surface adjacent opening 26. An impurity diffusion is performed to produce an n-type region 27 adjacent the surface of epitaxial layer 23 and spaced from opening 26. A source contact 28 is formed in contact with region 27 and a drain contact 29 is formed on the reverse surface of substrate 22. The operation of transistor 20 is basically the same as transistor 10, with gate contact 25 forming a channel in epitaxial layer 23 between region 27 and substrate 22.

The properties of silicon carbide (SiC) make it an excellent choice for power FET devices. Silicon carbide has a breakdown field approximately ten times that of silicon, which permits a thinner, and more heavily doped blocking layer, so that for equivalent reverse breakdown voltage a silicon carbide transistor exhibits more than an order of magnitude lower forward-bias ON-resistance than a silicon transistor of the same geometry. Further, silicon carbide has a thermal conductivity approximately three times that of silicon, which permits silicon carbide to support a significantly higher ON-state current density. Also, silicon carbide has a larger bandgap which permits operation at higher temperatures. Other semiconductor materials, such as diamond, gallium nitride, aluminum nitride, etc. may also have some or all of these properties and may be used in place of silicon carbide in some of the disclosed embodiments.

However, it is impractical to attempt to fabricate transistor 10 of FIG. 1 in silicon carbide because diffusion coefficients in silicon carbide are so low that impurity diffusion is only possible at temperatures exceeding 1800° C. Transistor 10 is also difficult to fabricate in silicon carbide by using ion implantation instead of diffusion, since in high voltage designs p-type region 16 is so thick that an impractically high implant energy would be required.

Transistor 20 of FIG. 2 is difficult to fabricate in silicon carbide because silicon carbide is impervious to most wet etches and plasma etching produces nearly vertical sidewalls. Slightly sloped sidewalls have been produced by $CBrF_3/75\%$ $O_2$ plasma etching with a 6.3:1 vertical:lateral etch rate ratio. However, forming a high quality MOS device on such an etched sidewall is expected to be extremely difficult because of the anticipated defects on the etched silicon carbide sidewall surface.

Figure 3:
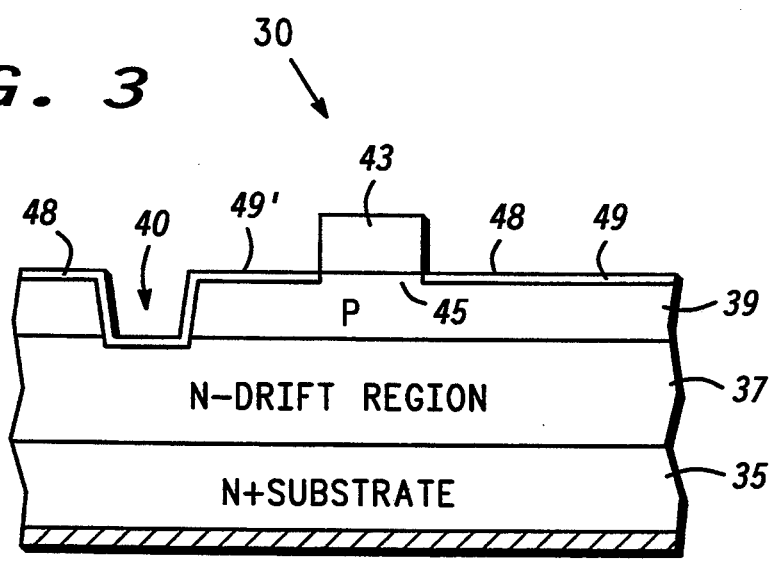
FIGS. 3 and 4 are partial sectional views of two sequential structures in a process according to the present invention.
Figure 4:
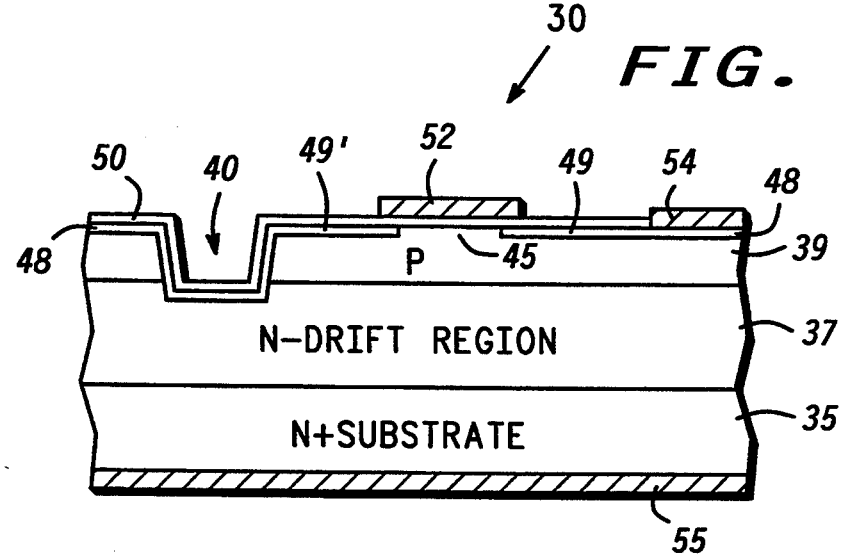

To overcome the various material, process, and structure disadvantages set forth above, a new and improved method of fabricating a FET from silicon carbide and the like is described herein, along with the resulting FET. While the disclosed embodiments have been limited to silicon carbide for convenience of description, it will be understood that other semiconductor materials, such as diamond, gallium nitride, aluminum nitride, etc may be used. Also, a MOSFET is described throughout for convenience but it will be understood that other devices, such as MESFET, JFET, and either enhancement or depletion modes can be fabricated in accordance with the present invention. Referring to FIG. 3, a partial sectional view of an intermediate stage in the fabrication of a transistor 30 is illustrated. It should be understood that FIGS. 3 and 4 illustrate approximately one half of transistor 30 with a left portion removed for convenience of description. Transistor 30 includes a silicon carbide substrate 35 which, in this specific embodiment, is doped with a relatively high level of impurities ($>10^{18}$) to produce n+ conductivity. A first epitaxial layer 37 is formed on the upper surface of substrate 35 and is doped relatively lightly ($\sim 10^{16}$) to produce n− conductivity. A second epitaxial layer 39 is formed on the upper surface of epitaxial layer 37 and is doped to produce p conductivity.

An opening 40 is formed in second epitaxial layer 39 by some convenient means, such as plasma etching or the like. Opening 40 extends from the upper surface of second epitaxial layer 39 at least to the surface of first epitaxial layer 37 and may extend a short distance into first epitaxial layer 37, if desired.

A mask 43 is formed on the upper surface of second epitaxial layer 39 to define and protect a gate region 45. Mask 43 is formed of a pattern of polycrystalline silicon, or refractory material that can withstand ion implant and anneal temperatures. With mask 43 in place, a shallow n-type conductivity layer 48 is produced adjacent the upper surface of second epitaxial layer 39. Gate region 45 divides layer 48 into two parts, with the part to the right of gate region 45 (in FIGS. 3 and 4) being designated 49 and the part to the left of gate region 45 being designated 49'. In this specific embodiment, layer 48 is produced by an ion implantation process, which for simplicity is deemed to include annealing and other well known steps utilized to form a relatively uniform layer. Also in this specific embodiment, layer 48 is formed on the slightly sloped sides and bottom of opening 40, for reasons which will become apparent presently. It will be apparent to those skilled in the art that in a different embodiment layer 48 can be formed as a thin epitaxial layer grown on the surface of second epitaxial layer 39, or by any convenient combinations of epitaxial layers and the ion implant process, or by any other doping techniques.

Transistor 30 is completed by removing mask 43 and forming a layer 50 of gate oxide on the upper surface of the structure, as illustrated in FIG. 4. It will of course be understood that layer 50 of gate oxide is formed in a MOSFET but is not included in, for example, a MESFET. A refractory material is deposited on layer 50 in overlying relationship to gate region 45 to form a gate contact 52. While a refractory material is utilized in this embodiment for gate contact 52 and for other contacts to be described, it should be understood by those skilled in the art that any conducting material compatible with the fabrication technique and the use of the device may be used. A portion of layer 50 overlying part 49 of layer 48 is removed to expose an upper surface of layer 48 which defines, in conjunction with layer 48, a source region. A refractory material is deposited on the exposed upper surface of layer 48 to form a source contact 54.

While not shown, it will be understood by those skilled in the art that source contact 54 also contacts layer 39 in a well known manner, which provides a substantially short circuit across layer 48 to effectively short any parasitic transistor formed therein. A convenient conducting layer, is deposited on the rear, or lower, surface of substrate 35 to form a drain contact 55. The portions of layer 50 not actually under gate contact 52 can be increased to a greater thickness by any of several well known processes in order to provide more effective surface passivation.

In transistor 30, the proper application of voltages causes gate contact 52 to produce a current channel in layer 39 from part 49 to part 49' of layer 48 in a manner well known in the art. In the ON state, current flows from source contact 54 along part 49 of layer 48, through the inversion layer under gate contact 52 (gate region 45) to part 49' of layer 48 and then to layer 37, substrate 35 and drain contact 55. In the OFF state, the source-drain voltage drops across the p/n junction (primarily depleted layer 37). For proper device operation the n+ doping level and thickness of layer 48 is carefully chosen so that when transistor 30 is in the OFF state layer 48 will not break down under bias, but will fully deplete so that the high reverse voltage across the p/n junction primarily drops across layer 37.

Figure 5:
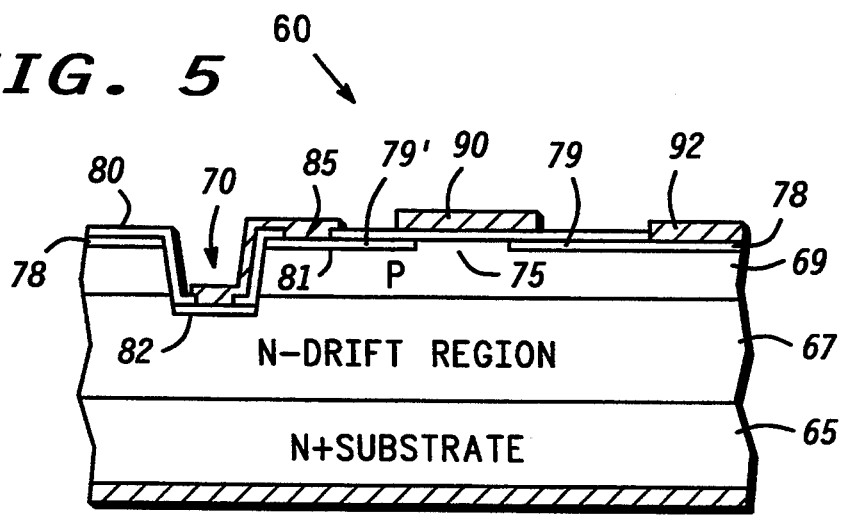
FIG. 5 is a partial sectional view of another structure fabricated in accordance with the present invention.

FIG. 5 illustrates another embodiment of a silicon carbide MOSFET 60 fabricated by a process in accordance with the present invention and designed to overcome the various material, process, and structure disadvantages set forth above. It should be understood that FIG. 5 illustrates approximately one half of transistor 60 with a left portion removed for convenience of description. Transistor 60 includes a silicon carbide substrate 65 which, in this specific embodiment, is doped with a relatively high level of impurities ($>10^{18}$) to produce n+ conductivity. A first epitaxial layer 67 is formed on the upper surface of substrate 65 and is doped relatively lightly ($\sim 10^{16}$) to produce n− conductivity. A second epitaxial layer 69 is formed on the upper surface of epitaxial layer 67 and is doped to produce p conductivity.

An opening 70 is formed in second epitaxial layer 69 by some convenient means, such as plasma etching or the like. Opening 70 extends from the upper surface of second epitaxial layer 69 at least to the surface of first epitaxial layer 67 and may extend a short distance into first epitaxial layer 67, if desired.

A mask (not illustrated) is formed on the upper surface of second epitaxial layer 69 to define and protect a gate region 75. The mask is formed of a pattern of polycrystalline silicon, or refractory material that can withstand ion implant and anneal temperatures, as explained above. With the mask in place, a shallow n+ layer 78 is produced adjacent the upper surface of second epitaxial layer 69 by the ion implantation process, or a third epitaxial layer is grown on the upper surface of second epitaxial layer 69, or by some combination of the two processes as previously described. Layer 78 is divided by gate region 75 into a part, designated 79, to the right of gate region 75 (in FIG. 5) and a part, designated 79', to the left of gate region 75. For reasons that will become apparent presently, it is not essential that part 79' of layer 78 be formed along the sidewalls and bottom of opening 70. In fact, in some embodiments it may be desirable to form opening 70 after the formation of layer 78.

Once layer 78 is completed, the mask is removed and a layer 80 of gate oxide is formed on the upper surface of the structure, as described above. An opening 81 is formed through gate oxide layer 80 adjacent opening 70 and in communication with layer 78. A second opening 82 through gate oxide layer 80 and in communication with substrate 65 through layer 67 is formed in the bottom surface of opening 70. A layer 85 of conductive material is formed on the surface of gate oxide layer 80 and in the openings 81 and 82 so as to provide a substantially short circuit between part 79' of layer 78 and substrate 65. Thus, it can be seen that a complete layer 78 on the sidewalls of opening 70 is not required to provide the short circuit connecting part 79' of layer 78 to substrate 65. Since it is not necessary to form part 79' of layer 78 on the sidewalls of opening 70, the sidewalls need not be sloped and can, in fact, be vertical. It should be understood that virtually any shape of opening 70 can be used as long as layer 85 is (can be) formed continuously from opening 81 to opening 82. It is convenient for the purposes of making a good electrical connection between layer 85 and layer 67 to provide some of layer 78 in the bottom of opening 70 (as illustrated in FIG. 5).

Transistor 60 is completed by depositing a conducting material on layer 80 in overlying relationship to gate region 75 to form a gate contact 90. A portion of layer 80 is removed to expose an upper surface of part 79 of layer 78 which defines, in conjunction with layer 78, a source region. A conductive material is deposited on the exposed upper surface of part 79 of layer 78 to form a source contact 92. While not shown, it will be understood by those skilled in the art that source contact 92 also contacts layer 69 in any well known manner to short parasitic transistors. A convenient conducting material is deposited on the rear, or lower, surface of substrate 65 to form a drain contact 95. The portions of layer 80 not actually under gate contact 90 can be increased to a greater thickness by any of several well known processes in order to provide more effective surface passivation.

Thus, a new and improved method of fabricating MOSFETs in silicon carbide is disclosed which does not require the use of impurity diffusion or wet chemical etching. Further, the method described fabricates a new and improved vertical MOSFET from silicon carbide, which offers the advantages of high breakdown voltages and high current capability in small die area. The novel methods provide a high quality MOS gate region at the top surface of the device and a low resistance shorting contact of heavily doped material or metal which connects the source to the drift region in the device ON state. Further, the device can be manufactured with no diffusion steps.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a vertical FET comprising the steps of:
   providing a semiconductor substrate of a first conductivity type with a surface;

forming a first epitaxial layer of the first conductivity type on the surface of the substrate, which epitaxial layer is relatively lightly doped compared to the substrate and includes a surface;

forming a second epitaxial layer of a second conductivity type on the surface of the first epitaxial layer, the second epitaxial layer having a surface;

forming an opening through the second epitaxial layer from the surface of the second epitaxial layer so as to at least communicate with the first epitaxial layer;

forming a relatively thin layer of the first conductivity type adjacent the surface of the second epitaxial layer, the relatively thin layer having an opening therethrough defining a gate region, the relatively thin layer providing a substantially short circuit in the opening from the relatively thin layer to the first epitaxial layer;

forming a gate contact in overlying relationship to the gate region;

defining a source region in spaced relation from the gate region; and forming a source contact on the defined source region.

2. A method of fabricating a vertical FET as claimed in claim 1 wherein the step of forming a relatively thin layer of the first conductivity type includes implanting a dopant into the second epitaxial layer.

3. A method of fabricating a vertical FET as claimed in claim 1 wherein the step of forming a relatively thin layer of the first conductivity type includes forming a third epitaxial layer of the first conductivity type.

4. A method of fabricating a vertical FET as claimed in claim 1 wherein the steps of forming a relatively thin layer of the first conductivity type adjacent the surface of the second epitaxial layer and forming a conductive layer in the opening through the second epitaxial layer include forming the relatively thin layer adjacent surfaces of the opening through the second epitaxial layer and forming the relatively thin layer with a relatively heavy doping compared to the first epitaxial layer so as to provide a substantially short circuit in the opening.

5. A method of fabricating a vertical FET comprising the steps of:

providing a semiconductor substrate of a first conductivity type with a surface;

forming a first epitaxial layer of the first conductivity type on the surface of the substrate, which epitaxial layer is relatively lightly doped compared to the substrate and includes a surface;

forming a second epitaxial layer of a second conductivity type on the surface of the first epitaxial layer, the second epitaxial layer having a surface;

forming an opening through the second epitaxial layer from the surface of the second epitaxial layer so as to at least communicate with the first epitaxial layer;

forming a relatively thin layer of the first conductivity type adjacent the surface of the second epitaxial layer, the relatively thin layer having an opening therethrough defining a gate region;

forming a conductive layer in the opening through the second epitaxial layer, the conductive layer providing a substantially short circuit in the opening from the relatively thin layer to the first epitaxial layer forming a gate contact in overlying relationship to the gate region;

defining a source region in spaced relation from the gate region; and forming a source contact on the defined source region.

6. A method of fabricating a vertical FET as claimed in claim 5 wherein the step of forming a relatively thin layer of the first conductivity type includes implanting a dopant into the second epitaxial layer.

7. A method of fabricating a vertical FET as claimed in claim 5 wherein the step of forming a relatively thin layer of the first conductivity type includes forming a third epitaxial layer of the first conductivity type.

8. A method of fabricating a vertical FET as claimed in claim 5 wherein the step of forming a conductive layer in the opening through the second epitaxial layer includes implanting a dopant into the second epitaxial layer in the opening through the second epitaxial layer.

9. A method of fabricating a vertical FET as claimed in claim 5 wherein the step of forming a conductive layer in the opening through the second epitaxial layer includes forming a third epitaxial layer of the first conductivity type in the opening through the second epitaxial layer.

10. A method of fabricating a vertical FET as claimed in claim 5 wherein the step of forming a conductive layer in the opening through the second epitaxial layer includes forming a metal layer in the opening through the second epitaxial layer.

11. A method of fabricating a vertical FET comprising the steps of:

providing a semiconductor substrate of a first conductivity type with a surface;

forming a first epitaxial layer of the first conductivity type on the surface of the substrate, which epitaxial layer is relatively lightly doped compared to the substrate and includes a surface;

forming a second epitaxial layer of a second conductivity type on the surface of the first epitaxial layer, the second epitaxial layer having a surface;

forming a relatively thin layer of the first conductivity type adjacent the surface of the second epitaxial layer, the relatively thin layer including an opening through the relatively thin layer defining a gate region;

forming an opening through the relatively thin layer and the second epitaxial layer at least into communication with the first epitaxial layer;

providing a substantially short circuit in the opening from the relatively thin layer to the first epitaxial layer;

forming a gate contact in overlying relationship to the gate region;

defining a source region in spaced relation from the gate region; and forming a source contact on the defined source region.

12. A method of fabricating a vertical FET as claimed in claim 11 wherein the step of forming a relatively thin layer of the first conductivity type includes implanting a dopant into the second epitaxial layer.

13. A method of fabricating a vertical FET as claimed in claim 11 including in addition the step of providing a mask prior to the step of forming an opening through the relatively thin layer to define the opening.

14. A method of fabricating a vertical FET as claimed in claim 13 wherein the step of providing a mask includes providing a mask of refractory material capable of withstanding ion implant temperatures.

15. A method of fabricating a vertical FET as claimed in claim 11 wherein the step of forming a relatively thin layer of the first conductivity type includes forming a third epitaxial layer of the first conductivity type.

16. A method of fabricating a vertical FET as claimed in claim 11 wherein the step of forming an opening through the relatively thin layer and the second epitaxial layer includes etching the relatively thin layer and the second epitaxial layer to define the opening.

17. A method of fabricating a vertical FET as claimed in claim 16 wherein the step of etching the relatively thin layer and the second epitaxial layer includes plasma etching.

18. A method of fabricating a vertical FET as claimed in claim 11 wherein the step of forming a gate contact includes the step of forming a layer of gate oxide at least on the relatively thin layer and forming a gate contact in overlying relationship to the gate region.

19. A method of fabricating a vertical FET as claimed in claim 18 including in addition the step of increasing the thickness of the layer of gate oxide not covered by the gate contact to provide passivation of the vertical FET.

20. A method of fabricating a vertical FET as claimed in claim 11 including in addition the step of forming a drain contact on a second surface of the substrate.

21. A method of fabricating a silicon carbide vertical MOSFET comprising the steps of:

providing a silicon carbide substrate of a first conductivity type with a surface;

forming a first epitaxial layer of the first conductivity type on the surface of the substrate, which epitaxial layer is relatively lightly doped compared to the substrate and includes a surface;

forming a second epitaxial layer of a second conductivity type on the surface of the first epitaxial layer;

forming an opening through the second epitaxial layer from the surface of the second epitaxial layer so as to at least communicate with the first epitaxial layer;

providing a mask on the surface of the second epitaxial layer defining and protecting a gate region;

forming a relatively thin layer of the first conductivity type adjacent the surface of the second epitaxial layer;

removing the mask;

forming a layer of gate oxide on the relatively thin layer and the defined gate region;

forming a gate contact on the layer of gate oxide in overlying relationship to the gate region;

forming a conductive layer on the gate oxide in contact with the relatively thin layer of the first conductivity type, with the conductive layer extending into the opening through the second epitaxial layer and into contact with the first epitaxial layer;

defining a source region adjacent the opening through the second epitaxial layer by removing a portion of the layer of gate oxide; and forming a source contact of conductive material on the defined source region.

* * * * *